United States Patent [19]
Patel et al.

[11] Patent Number: 6,150,840
[45] Date of Patent: Nov. 21, 2000

[54] PROGRAMMABLE RETICLE STITCHING

[75] Inventors: Rakesh Patel, Cupertino; John Turner, Santa Cruz, both of Calif.

[73] Assignee: Altera Corporation, San Jose, Calif.

[21] Appl. No.: 09/067,617

[22] Filed: Apr. 28, 1998

Related U.S. Application Data

[60] Provisional application No. 60/043,213, Apr. 29, 1997.

[51] Int. Cl.[7] ................................................ H01L 25/00
[52] U.S. Cl. .............................. 326/41; 326/101; 257/620
[58] Field of Search ................................... 326/82, 86, 90, 326/30, 21, 101, 41, 39; 257/620, 619, 797

[56] References Cited

U.S. PATENT DOCUMENTS

| | | | |
|---|---|---|---|
| 4,987,319 | 1/1991 | Kawana | 307/465 |
| 5,491,353 | 2/1996 | Kean | 257/208 |
| 5,767,565 | 6/1998 | Reddy | 257/620 |
| 5,789,944 | 8/1998 | Choy et al. | 326/82 |
| 5,831,330 | 11/1998 | Chang | 257/620 |

*Primary Examiner*—Michael Tokar
*Assistant Examiner*—Anh Tran
*Attorney, Agent, or Firm*—Babak S. Sani; Townsend and Townsend and Crew LLP

[57] ABSTRACT

Design methodologies and techniques for significantly increasing logic density by stitching multiple reticles together are disclosed. The invention teaches various techniques to ensure continuity of interconnections and sealing mechanisms across the stitch region. The stitch extended device is readily scalable to allow quick transitions to next generation technologies.

21 Claims, 7 Drawing Sheets

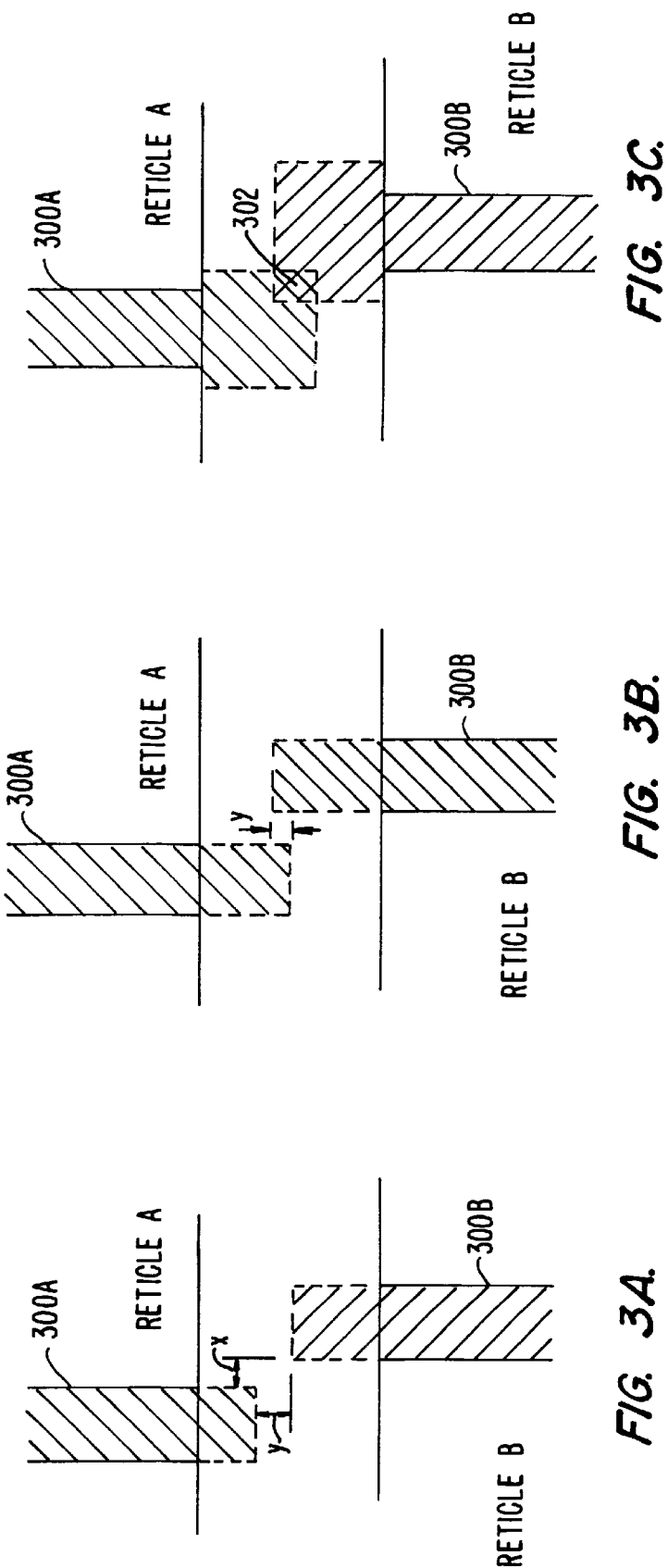

PROGRAMMABLE RETICLE STITCHING

CROSS REFERENCE TO RELATED APPLICATIONS

This application is a non-provisional of and claims priority from U.S. Provisional Application Serial No. 60/043,213 filed Apr. 29, 1997, the disclosure of which is incorporated herein by reference for all purposes.

BACKGROUND OF THE INVENTION

The present invention relates in general to manufacture of semiconductor devices, and in particular to various techniques to manufacture semiconductor devices having significantly larger size and circuit density.

With advances in design and manufacture of semiconductor devices, it has become possible to integrate increasingly larger amounts of circuitry on a single die. Today the size of a die can easily approach the limits of existing manufacturing equipment. Semiconductor manufacturing equipment that are designed to process silicon wafers divide each wafer into various reticles that are processed simultaneously. For a relatively smaller die, a reticle may contain multiple dies. However, it is now possible to design and integrated enough circuitry on a die that may be as large or even larger than a reticle. There is therefore a need for solutions to the problems posed by die sizes reaching the reticle limitations of semiconductor manufacturing equipment.

SUMMARY OF THE INVENTION

The present invention provides various techniques that allow for designing and manufacturing integrated circuits that consume silicon area larger than a single reticle. The invention develops novel stitching techniques that permit communication across reticles. Various techniques to ensure continuity of interconnections and sealing mechanisms across the stitch region are also disclosed. The stitch extended device is readily scalable to allow quick transitions to next generation technologies.

Accordingly, in one embodiment, the present invention provides an electronic device including a first semiconductor die having first logic circuitry coupled to a first plurality of interconnect lines, and further having a first buffer coupled to a one of the first plurality of interconnect lines; and a second semiconductor die having second logic circuitry coupled to a second plurality of interconnect lines, and further having a second buffer coupled to one of the second plurality of interconnect lines, wherein, the first buffer couples to the second buffer across a stitch region between the first and second semiconductor dies.

In another embodiment, the present invention provides a programmable logic circuit including a plurality of logic elements coupled to a plurality of interconnect lines; and a plurality of bidirectional buffers respectively coupled to the plurality of interconnect lines, wherein, the plurality of bi-directional buffers are configured to couple the plurality of interconnect lines to a second plurality of interconnect lines of a programmable logic circuit on an adjoining die.

In yet another embodiment, the present invention provides a method of manufacturing an electronic device that includes the steps of fabricating first logic circuitry having a first plurality of interconnect lines on a first die on a silicon wafer; fabricating second logic circuitry having a second plurality of interconnect lines on a second die on said silicon wafer adjacent to the first die; and providing a plurality of bidirectional buffers to selectively couple the first plurality of interconnect lines on the first die to the second plurality of interconnect lines on the second die over a stitch region between the first and second die via a plurality of stitch interconnect lines.

The present invention also provides for a method of manufacturing an electronic device that includes the steps of fabricating an integrated circuit using a first generation technology on at least two silicon dies stitched together by bi-directional interconnect lines; shrinking the size of the integrated circuit by multiplying it by a second generation technology scale factor to arrive at a scaled down integrated circuit; and fabricating the scaled down integrated circuit using said second generation technology on a single die.

A better understanding of the nature and advantages of the reticle stitching techniques of the present invention may be gained by reference to the detailed description and drawings below.

BRIEF DESCRIPTION OF THE DRAWINGS

FIGS. 3A, 3B, 3C and 3D show extension of interconnect lines over the stitch region and methods of eliminating potential gaps between the extensions according to the present invention;

DESCRIPTION OF THE PREFERRED EMBODIMENT

Figure 1:
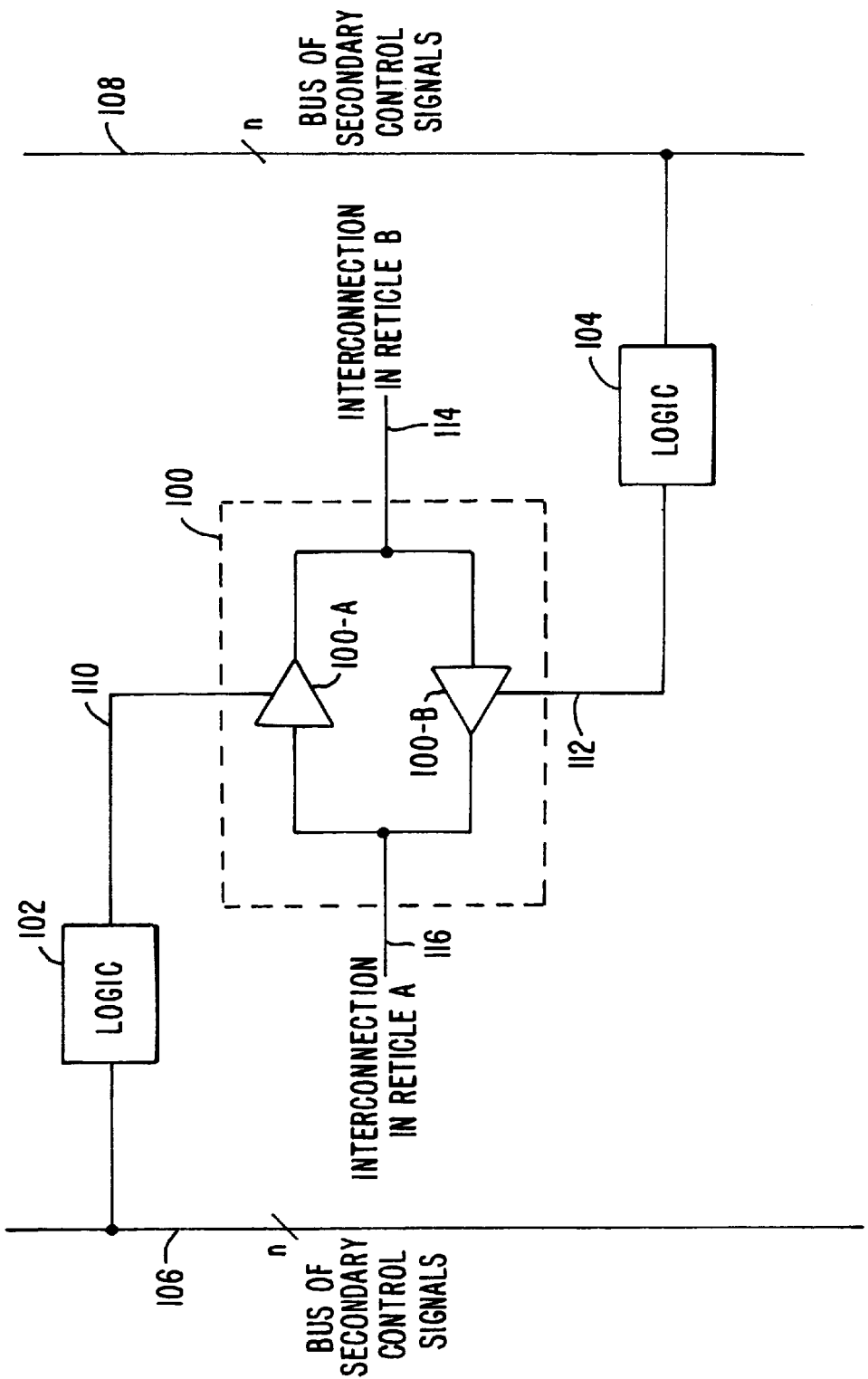
FIG. 1 shows a simplified and exemplary circuit implementation of cross-reticle communication according to one embodiment of the present invention.

Referring to FIG. 1, there is shown a circuit according to a simplified embodiment of the present invention that provides circuitry for communicating across reticles. The circuit includes a bi-directional buffer 100 that includes a tri-statable driver 100-A that drives the signal in the direction of reticle A to reticle B, and a tri-statable driver 100-B that drives the signal in the direction of reticle B to reticle A. Driver 100-A receives a tri-state control signal 110 from logic 102. Logic 102 is controlled by signals received from a secondary control bus 106, or alternatively by signals supplied by a programmable element (not shown). Driver 100-B receives a tri-state control signal 112 from logic 104. Logic 104 is controlled by signals from a secondary control bus 108. Depending on the direction of the signal, one or the other of the drivers 100-A or 100-B is enabled. Both drivers are tri-stated in the case where the signal on the interconnect need not cross over to the other reticle.

Figure 2A:
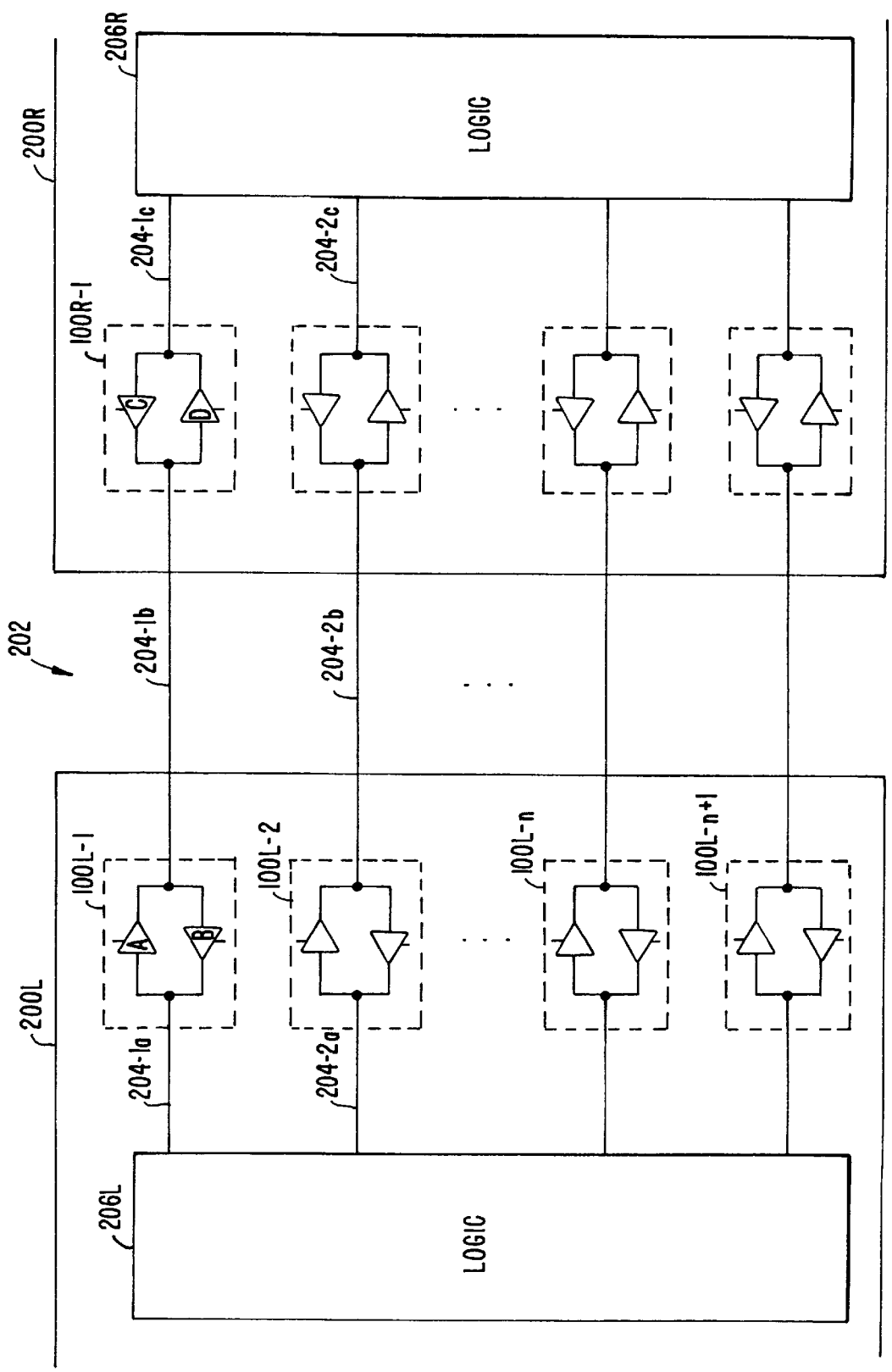
FIG. 2A is a block diagram illustrating the stitching of two separate dies.

In a preferred embodiment, each adjoining reticle includes one or more buffers 100 respectively connected to interconnect lines that traverse the stitch region. Each buffer 100 is preferably located near the edge of the reticle. FIG. 2A shows two reticles 200L and 200R each having a plurality of bi-directional buffers 100 that facilitate communication between the two reticles over stitch region 202. Interconnect lines 204 that traverse stitch region 202 are divided into at least three segments. Referring to the top most interconnect line 204-1 in FIG. 2A, it is made up of a first segment 204-1a that is internal to die 200L and connects logic 206L to bi-directional buffer 100L-1, a second segment 204-1b that crosses over stitch region 202 and connects between bi-directional buffer 100L-1 in die 200L and bi-directional buffer 100R-1 in die 200R, and a third segment 204-1c that is internal to die 200R and connects between bi-directional buffer 100R-1 and logic 206R.

Buffers 100 perform several functions. One is to provide added drive capability to improve signal quality and integrity over interconnect lines that are significantly longer as a result of the stitching of two dies. Another, is to provide the bi-direction functionality. further, by dividing what is essentially a single interconnect line into segments, buffers 100 can add to interconnect resources. According to a preferred embodiment for accomplishing these functions, each buffer 100 includes two tri-stateable drivers as discussed above. Thus, for a signal that is to travel from logic 206L to logic 206R, driver A in buffer 100L-1 is enabled while driver B is tri-stated, and driver D in buffer 100R-1 is enabled while driver C is tri-stated. The state of the drivers are reversed for a signal travelling in the opposite direction. Drivers A and C are included to improve signal integrity over interconnect segment 204-1b in the stitch region. Therefore, in an embodiment where logic blocks 206L and 206R provide internal drivers that are strong enough to drive the entire stitch-extended interconnect line, drivers A and C are not needed and may be removed all together (i.e., buffers 100 would be unidirectional). Also, not every interconnect line 204 may have to travel between the two dies. For those interconnect lines that are used internally only, both drivers in the respective buffers in each die are tri-stated. It is in this mode that the interconnect segmentation according to the present invention adds to the overall routing resources within the stitch-extended logic circuit.

Figure 2B:
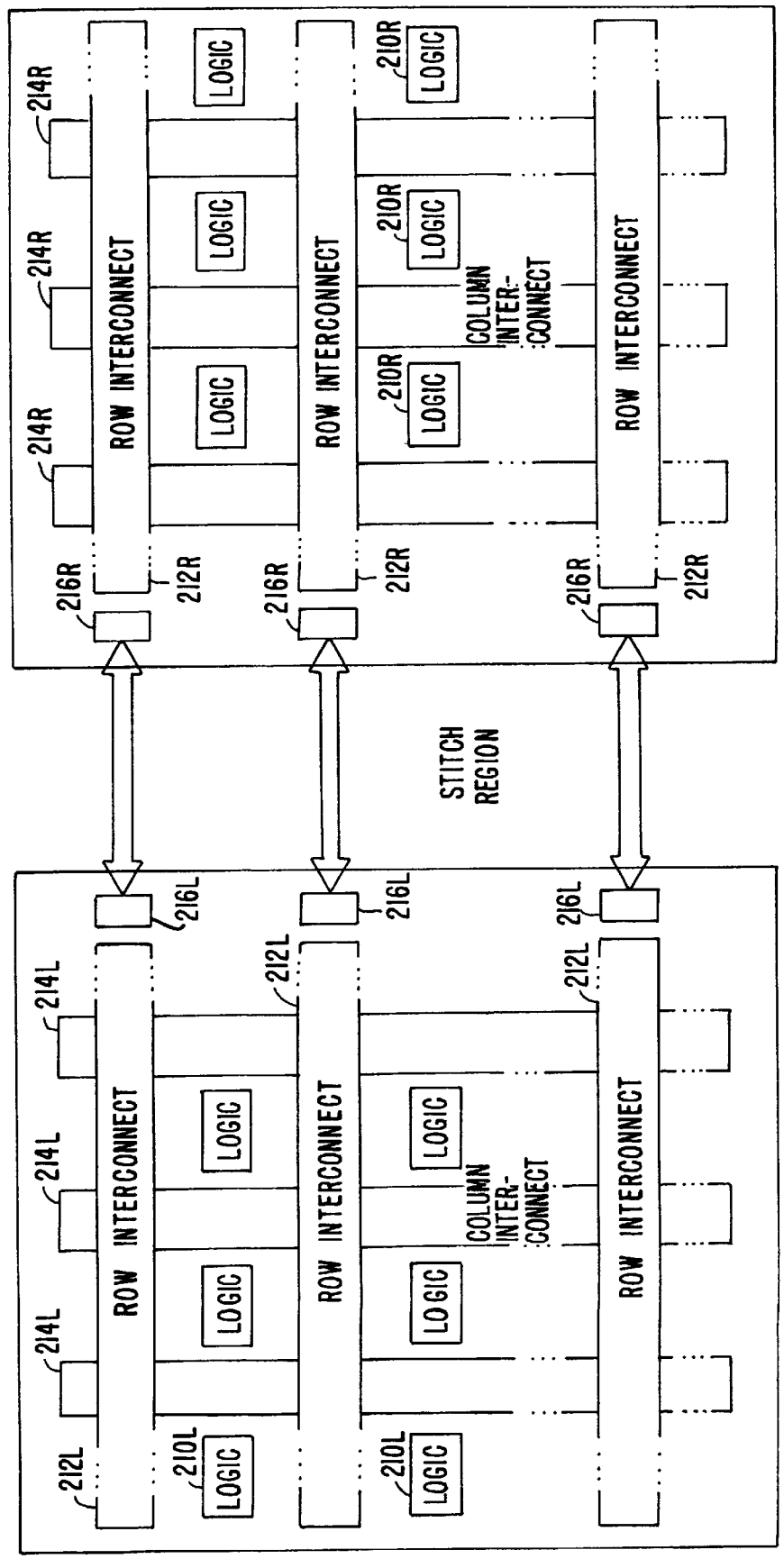
FIG. 2B shows the reticle stitching technique of the present invention as applied to an exemplary complex programmable logic device.

While the reticle stitching technique of the present invention is applicable to a variety of circuit technologies, it is particularly suitable for manufacture of high density complex programmable logic devices (CPLDs). A simplified example of a reticle stitched CPLD is shown in FIG. 2B. Each half of the CPLD includes an array of programmable logic elements (or blocks) 210 that are interconnected by a matrix of programmable row interconnect lines 212 and column interconnect lines 214. In the exemplary embodiment shown, the CPLD is divided into two halves in the direction of rows of logic elements (or logic blocks) with each half placed in a separate reticle. Bi-directional buffers 216 are located at the edge of each die and allow extension of the row interconnect lines over the stitch region for bi-directional communication between the two halves. Exemplary embodiments of the internal circuity of a CPLD are described in greater detail in the Altera Data Book published by Altera Corporation (June 1996), wherein comprehensive information about Altera's family of FLEX and MAX PLDs are provided, all of which is hereby incorporated by reference. It is to be understood that the CPLD can be similarly divided into two halves in the direction of columns of logic elements, with stitch-extended column interconnect lines 214.

The programming of such a CPLD can be accomplished either by having a separate programmer for each die, or by a single programmer that configures both dies (i.e., the entire CPLD). While it increases the overhead, two separate programmers with independent resources can configure the CPLD faster, reduce the number of interconnect lines that would have to cross the stitch region, and make redundancy more efficient. On the other hand, using a single programmer requires less overhead circuitry, but it would take longer to configure the entire CPLD and would require programming data lines that cross the stitch region.

According to a preferred embodiment of the present invention a number of practical and mechanical limitations are overcome to facilitate reticle stitching. One of these limitations relates to alignment tolerances of the manufacturing equipment used to process the silicon wafers. As discussed above, multiple dies are formed on the surface of a single wafer. During the manufacturing process, a stepper machine is used to guide the movement of a processing arm of the equipment from reticle to reticle on a die. Because the reticle stitching technique of the present invention requires interconnect lines to cross reticle boundaries and extend into the stitch region, special provisions are made to avoid potential gaps in the continuity of the interconnect lines that may be caused by stepper misalignment. FIG. 3A illustrates the conditions under which gaps in interconnect continuity can appear in the stitch region. Assuming interconnect lines 300A and 300B are an exemplary 2 $\mu$m in width each, and that the stepper has an alignment tolerance of $\pm 1.5 \mu$m, under worst case conditions where maximum misalignment occurs in both directions, a 1 $\mu$m gap can appear between the two interconnect lines as shown in FIG. 3A.

Figure 3D:
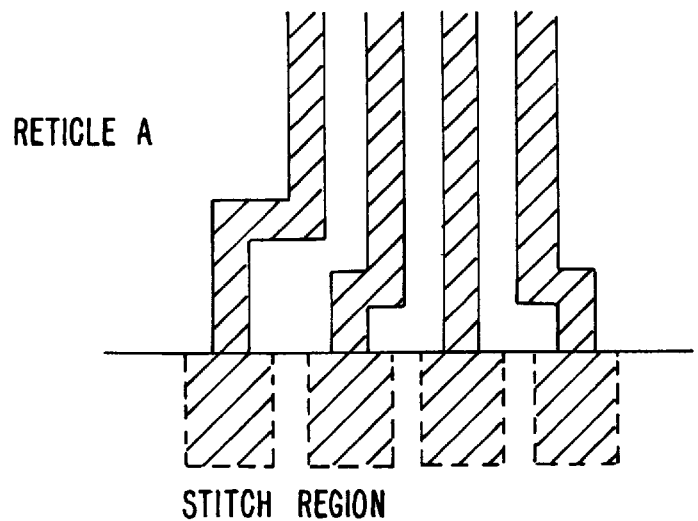

To eliminate any potential for a gap in the Y direction, the part of each interconnect line that extends into the stitch region (shown with broken lines) is made longer than the half distance to ensure an overlap of y $\mu$m in the Y direction as shown in FIG. 3B. A gap, however, still exists between the two interconnect lines in the X direction as shown in FIG. 3B. To eliminate the gap in the X direction, the extensions into the stitch region are made wider just enough to ensure overlap in the worst case condition. The overlapping interconnect lines 300A and 300B with wider extensions are shown in FIG. 3C, wherein an overlap region 302 with a width greater than the minimum required distance is shown. In the case of CPLDs where clusters of interconnect lines need to cross the reticle at various intervals along the edge of the die (see FIG. 2B), the widening of the extensions may require a staggering of the interconnect lines at the edge of the die. Stitch extended interconnect lines with the staggered arrangement to maintain the required minimum spacing between the lines are shown FIG. 3D.

Another aspect of the stitch-extended device that is impacted by the stepper misalignment is the sealing mechanism. To protect the intricate circuitry on a die from external contaminants, each die on a wafer is covered by a blanket layer of passivation and sealed by a water resistant ring of sealant material around its periphery. The die seal is typically made up of a ring of metal-via-metal-contact sandwich around the die. To enable stitching of two adjacent dies (each being the size of a reticle), the seal mechanism for each die is broken along the stitch region and then connected to the seal around the adjacent die to form a continuous ring of sealant around the entire two-reticle device. Any misalignment in the stepper will thus directly impact the integrity of the seal at the location of contact between the seals from the two adjacent dies. Because the width of the seal structure is not modifiable, techniques other than the ones described in connection with the interconnect lines must be utilized to ensure continuity of the seal structure in the X direction.

Figure 4:
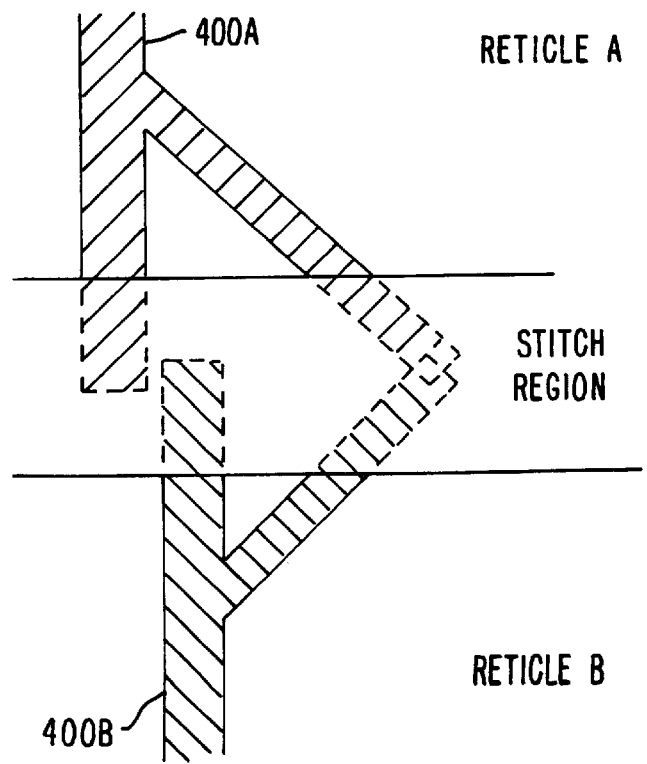
FIG. 4 depicts a mechanism to ensure continuity of the die seal around the reticle stitched device according to the present invention.
Figure 5:
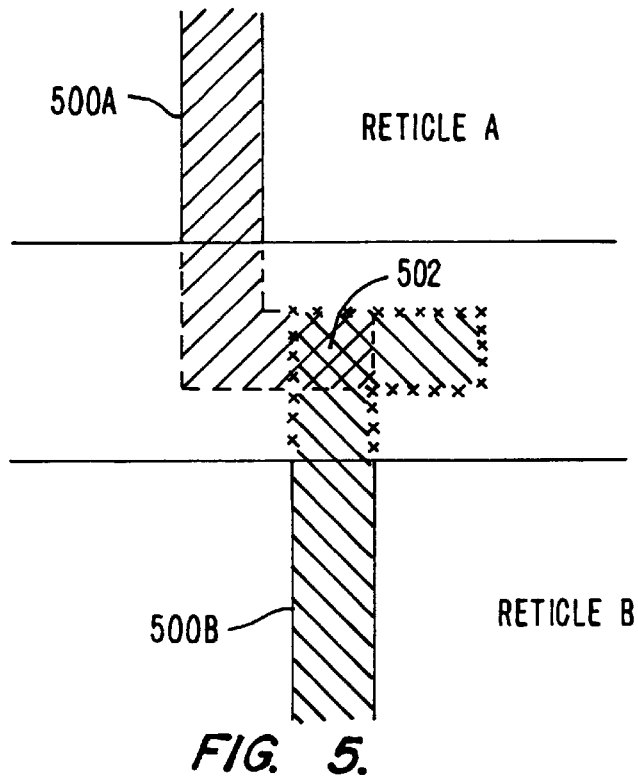
FIG. 5 shows an alternate mechanism for ensuring the integrity of the die seal at the junction of the two dies.
Figure 7:
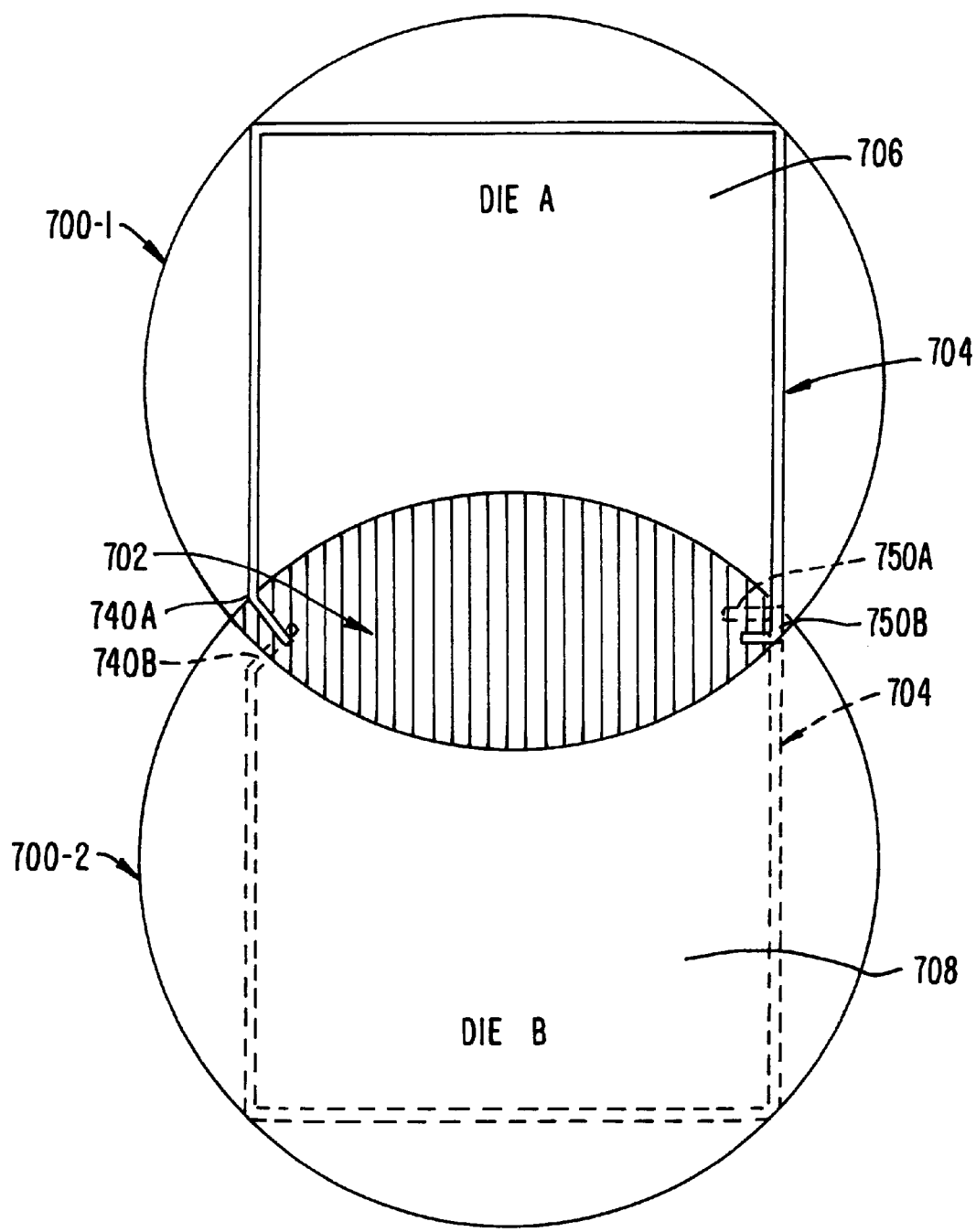
FIG. 7 is a diagram illustrating a continuous ring formed by two seal structures.

One example of a method to ensure the integrity of the seal while maintaining the same dimensions for the seal structure is shown in FIG. 4. In addition to the longer extensions into the stitch region (shown with broken line), the seal structure includes a branch that extends out at an angle from the side of the seal structure at the edge of each die. This angled extension has the same dimensions as the main seal structure and its length is adjusted such that an overlap occurs between the two angled branches of the seal structure even under worst case misalignment conditions. An alternative approach is shown in FIG. 5 that minimizes the increase in die size. Instead of angled extensions, each seal structure in the stitch region is laid out in the shape of the letter L. By appropriately sizing the dimensions of the L shaped extensions, an overlap (region 502) is guaranteed even under worst case misalignment conditions. The continuous ring of sealant or sealing structure is illustrated in FIG. 7. The sealing structure 704 surrounds two semiconductor dies, A 706 and B 708, wherein each single die is contained within reticles 700-1 and 700-2, respectively. A reticle stitching region 702 is disposed between the two large die. FIG. 7 illustrates both embodiments for the overlap region. In one embodiment, the first seal structure having a branch structure 740A, provides a seal when overlapped with the second seal structure also having a branch structure 740B. In another embodiment, the first seal structure having an L-shaped structure 750A, provides a seal when overlapped with the second seal structure also having an L-shaped structure 750B. Once formed, the sealing structure 704 provides protection against contamination of the integrated circuitry within the dies.

Figure 6:
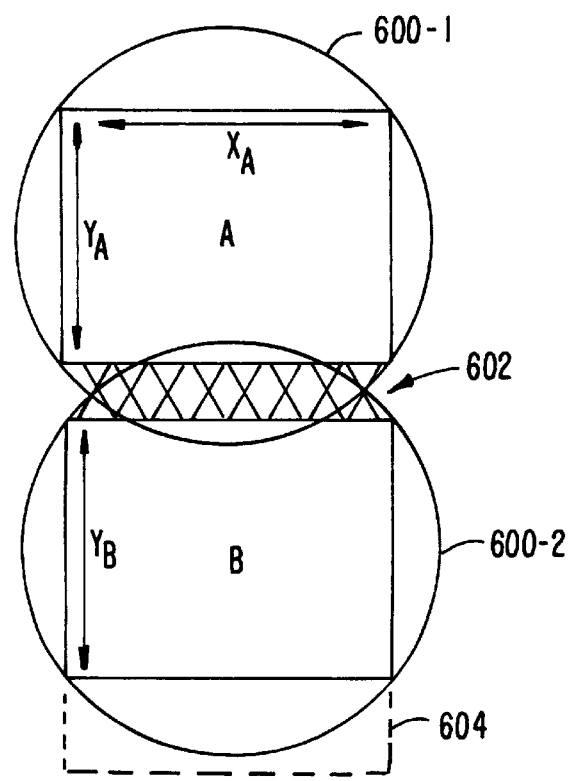
FIG. 6 is a diagram illustrating the scalability of the reticle-stitched device according to the present invention.

Another advantage of the reticle stitching technique of the present invention is that it can be made scalable to readily apply to scaled processes. Referring to FIG. 6, there is shown two reticles 600-1 and 600-2 each occupied by a single large die A and B, respectively. The two dies are interconnect over the reticle stitch region 602. The reticle stitching as taught by the present invention thus maximizes the logic density of the device for an existing technology with a given minimum feature size. As soon as the next generation technology with a smaller minimum feature size becomes viable, the existing data base can be readily scaled to fit on a single die reticle. If the scale factor is $F_s$, then the dimensions for the new die are given by:

$$X_A \times f_S = X_{new}$$

$$(Y_A + Y_B) \times f_S = Y_{new}$$

where, $X_A$, $Y_A$, and $Y_B$ are the die dimensions as shown in FIG. 5.

Once $X_{new}$ and $Y_{new}$ are known, the stitch region is removed from the data base, the data bases for dies A and B are collapsed together, and scaled by $f_S$ to generate the new data base for a single (reticle buster) die. This scaling technique thus enables a very fast introduction of next generation products with each technology shrink. It is to be understood that the example shown in FIG. 6 is for illustrative purposes only, and that the scalability in the context of stitch extended devices, as taught by the present invention, applies in a number of different applications. For example, the $(Y_A + Y_B)$ component in the scaling equations can easily vary in the case of CPLDs where rows of logic (see FIG. 2B) can be readily added or removed (604) as shown in FIG. 6. Furthermore, stitch extension can occur in both directions. That is, given a logic architecture for each chip that allows for extensions in both horizontal and vertical directions, a 2×2 matrix of dies can be stitched together to form a single device.

In conclusion, the present invention provides design methodologies and techniques for significantly increasing logic density by stitching multiple reticles together. Methodology is provided to ensure continuity of interconnections and sealing mechanisms across the stitch region. The stitch extended device is readily scalable to allow quick transitions to next generation technologies. While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. An electronic device comprising:
    a first semiconductor die, on a semiconductor wafer, comprising first logic circuitry coupled to a first plurality of interconnect lines, and further comprising a first buffer coupled to one of said first plurality of interconnect lines;
    a second semiconductor die, on said semiconductor wafer and adjacent to said first semiconductor die, comprising second logic circuitry coupled to a second plurality of interconnect lines, and further comprising a second buffer coupled to one of said second plurality of interconnect lines; and
    a stitch interconnect line extending over a stitch region on said semiconductor wafer between said first and said second semiconductor dies said, stitch interconnect line coupling said one of said first plurality of interconnect lines to one of said second plurality of interconnect lines,
    wherein, a geometric shape of said stitch interconnect line is modified compared with that of the interconnect lines on each die for preventing electrical discontinuity across reticle boundaries due to misalignment.

2. The electronic device of claim 1, wherein each one of said first and second buffers is bi-directional and comprises a first driver driving in a first direction, and a second driver driving in a second direction opposite to said first direction.

3. The electronic device of claim 2, wherein each of said first and second drivers is tri-stateable.

4. The electronic device of claim 3, wherein said first and second logic circuitry comprise programmable logic.

5. The electronic device of claim 4, further comprising a programmer to configure programmable logic for performing user-defined logical functions in both said first and second logic circuitry.

6. The electronic device of claim 5, wherein said programmer comprises a single programming circuitry shared by programmable logic in both of said first and second logic circuitry.

7. The electronic device of claim 5, wherein said programmer provides independent programming circuitry for programming logic in each of said first and second logic circuitry.

8. The electronic device of claim 1, wherein said first bi-directional buffer coupled to said second bi-directional buffer by a stitch interconnect line extending over said stitch region, and
    wherein, a width of a portion of said stitch interconnect line that extends over said stitch region is increased compared to the width of the interconnect lines on each die for preventing electrical discontinuity due to misalignment.

9. An electronic device comprising:
a first semiconductor die comprising first logic circuitry coupled to a first plurality of interconnect lines;
a second semiconductor die, comprising second logic circuitry coupled to a second plurality of interconnect lines;
a stitch region between said first and said second semiconductor dies, wherein said first plurality of interconnect lines are coupled to said second plurality of interconnect lines;
a first seal structure substantially surrounding edges of said first semiconductor die; and
a second seal structure substantially surrounding edges of said second semiconductor die,
wherein, said first seal structure and said second seal structure are configured at the edges of said stitch region to connect together to form a continuous ring around both said first and said second semiconductor dies.

10. The electronic device of claim 9, wherein each of said first and second seal structures comprises a branch at the edge of said stitch region extending at an angle to connect to a corresponding branch from the adjacent seal structure in case of misalignments.

11. The electronic device of claim 9, wherein each of said first and second seal structures comprises an L shaped extension into the stitch region to connect to a corresponding L shaped extension from the adjacent seal structure in case of misalignments.

12. An electronic device comprising:
a first seal structure substantially surrounding edges of a first semiconductor die on a semiconductor wafer; and
a second seal structure substantially surrounding edges of a second semiconductor die on said semiconductor wafer adjacent to said first semiconductor die,
wherein, said first seal structure and said second seal structure are configured at the edges of a stitch region to connect together to form a continuous ring around both said first and said second semiconductor dies.

13. The electronic device of claim 12, wherein said first semiconductor die, comprises first electronic circuitry coupled to a first plurality of interconnect lines; and
said second semiconductor die, comprises second electronic circuitry coupled to a second plurality of interconnect lines,
wherein, said first electronic circuitry couples to said second electronic circuitry across said stitch region between said first and said second semiconductor dies.

14. The electronic device as in claim 12, wherein each of said first and second seal structures comprises a branch at the edge of said stitch region extending at an angle to connect to a corresponding branch from the adjacent seal structure in case of misalignments.

15. The electronic device as in claim 12, wherein each of said first and second seal structures comprises an L-shaped extension into the stitch region to connect to a corresponding L-shaped extension from the adjacent seal structure in case of misalignments.

16. The electronic device of claim 13, wherein at least one of said first or said second semiconductor dies has a maximum die size; and
said maximum die size is at the size limitation of a reticle.

17. The electronic device of claim 13, wherein each of said first and second plurality of interconnect lines extend into said stitch region; and
each said plurality of interconnect lines terminate within said stitch region at a plurality of terminus structures; and
each said terminus structure within said stitch region is wider than each said plurality of interconnect lines to ensure overlap in case of misalignments.

18. The electronic device of claim 17, wherein each of said first and said second plurality of interconnect lines are staggered to maintain required minimum spacing; and
said staggering of each said first and said second plurality of interconnect lines may occur on at least one layer in each of the said first and said second semiconductor die.

19. A method of manufacturing an electronic device comprising the steps of:
fabricating a first seal structure substantially surrounding edges of a first semiconductor die;
fabricating a second seal structure substantially surrounding edges of a second semiconductor die, wherein the second semiconductor die is adjacent to the first semiconductor die;
coupling said first seal structure on said first die to said second seal structure on said second die at the edges of a stitch region between said first and second die; and
forming a continuous ring around both said first and said second semiconductor die.

20. A method of claim 19, wherein said step of forming said continuous ring around both said first and said second semiconductor comprises the steps of:
aligning a first reticle in relation to a first semiconductor wafer;
fabricating a first seal comprising a metal-via-metal-contact structure which substantially surrounds an edge of said first semiconductor die on said first semiconductor wafer;
aligning a second reticle in relation to a second semiconductor wafer;
fabricating a second seal comprising a metal-via-metal-contact which substantially surrounds an edge of said second semiconductor die on said second semiconductor wafer; and
connecting said first and said second seal structures.

21. A seal produced in accordance with the method of claim 19, wherein at least one of said first or said second semiconductor die has a maximum die size; and
said maximum die size is at the size limitation of a reticle.

* * * * *